United States Patent
Zwieback et al.

(10) Patent No.: US 8,858,709 B1
(45) Date of Patent: *Oct. 14, 2014

(54) SILICON CARBIDE WITH LOW NITROGEN CONTENT AND METHOD FOR PREPARATION

(75) Inventors: Ilya Zwieback, Washington Township, NJ (US); Avinash K. Gupta, Basking Ridge, NJ (US)

(73) Assignee: II-VI Incorporated, Saxonburg, PA (US)

( * ) Notice: Subject to any disclaimer, the term of this patent is extended or adjusted under 35 U.S.C. 154(b) by 1107 days.

This patent is subject to a terminal disclaimer.

(21) Appl. No.: 11/784,971

(22) Filed: Apr. 10, 2007

Related U.S. Application Data

(60) Provisional application No. 60/791,061, filed on Apr. 11, 2006.

(51) Int. Cl.
*C30B 23/00* (2006.01)

(52) U.S. Cl.
USPC ................ 117/105; 117/84; 117/88; 117/951

(58) Field of Classification Search
USPC ...................................... 117/84, 88, 105, 951
See application file for complete search history.

(56) References Cited

U.S. PATENT DOCUMENTS

| | | | |
|---|---|---|---|
| 3,424,628 A | 1/1969 | Winings | |
| 5,611,955 A | 3/1997 | Barrett et al. | |
| 5,667,587 A | 9/1997 | Glass et al. | |
| 5,683,507 A | 11/1997 | Barrett et al. | |
| 5,693,565 A | 12/1997 | Camilletti et al. | |
| 5,746,827 A | 5/1998 | Barrett et al. | |
| 5,895,526 A * | 4/1999 | Kitoh et al. | 117/84 |
| 6,336,971 B1 * | 1/2002 | Nagato et al. | 117/109 |
| 6,814,801 B2 | 11/2004 | Jenny et al. | |
| 8,361,227 B2 * | 1/2013 | Zwieback et al. | 117/102 |
| 2002/0083885 A1 * | 7/2002 | Kuhn et al. | 117/3 |
| 2002/0096108 A1 * | 7/2002 | Kuhn et al. | 117/200 |
| 2005/0126471 A1 | 6/2005 | Jenny et al. | |
| 2006/0024439 A2 | 2/2006 | Tuominen et al. | |

FOREIGN PATENT DOCUMENTS

| | | | |
|---|---|---|---|
| EP | 1567696 B1 | 7/2004 | |
| WO | WO 2005012602 A1 * | 2/2005 | C30B 23/00 |
| WO | WO 2006/017074 A2 * | 2/2006 | H01L 51/05 |

OTHER PUBLICATIONS

Y. M. Tairov and V. F. Tsvetkov; "Investigation of Growth Processes of Ingots of Silicon Carbide Single Crystals", Journal of Crystal Growth, vol. 43 (1978) pp. 209-212.

(Continued)

*Primary Examiner* — Matthew Song
(74) *Attorney, Agent, or Firm* — The Webb Law Firm

(57) ABSTRACT

A physical vapor deposition method of growing a crystal includes providing a seed crystal and a source material in spaced relation inside of a growth crucible that is at least in-part gas permeable to an unwanted gas. The growth chamber is heated whereupon the source material sublimates and is transported via a temperature gradient in the growth chamber to the seed crystal where the sublimated source material precipitates. Concurrent with heating the growth chamber, a purging gas is caused to flow inside or outside of the growth crucible in a manner whereupon the unwanted gas flows from the inside to the outside of the growth crucible via the gas permeable part thereof.

19 Claims, 5 Drawing Sheets

(56) References Cited

OTHER PUBLICATIONS

A. Elison et al.; "SiC Crystal Growth by HTCVD", Mat. Sci. Forum, vols. 457-460 (2004) pp. 9-14.

M. Fanton et al.; "Growth of Bulk SiC by Halide Chemical Vapor Deposition", Mat. Sci. Forum, vols. 457-460 (2004) pp. 87-90.

P. Wellman et al.; "Modified Physical Vapor Transport Growth of SiC—Control of Gas Phase Composition for Improved process Condition", Mat. Sci. Forum, vols. 483-485 (2005) pp. 25-30.

W. Espe et al.; "Getter Materials", http://www.thevalvepage.com/valvetek/getter/getter.htm, Apr. 9, 2007.

M. Fanton et al.; "Hybrid Physical-Chemical Vapor Transport Growth of SiC Bulk Crystals", Materials Science Forum, vols. 527-529 (2006) pp. 103-106.

G. Hennig; "Diffusion of Boron in Graphite", The Journal of Chemical Physics, vol. 42, No. 4, (Feb. 15, 1965) pp. 1167-1172.

T. Sogabe et al.; "Gas Permeability of a Large Cylindrical Isotropic Graphite", [Tanso 168, 176 (1995)] p. 284 of Tanso Abstracts.

M.A. Fanton et al.; "Growth of SiC Boules with Low Boron Concentration"; Materials Science Forum, vols. 527-529 (2006), pp. 47-50.

G.F. Hewitt; Chemistry and Physics of Carbon-A-Series of Advances; Edited by Philip L. Walker, Jr.; vol. 1; Copyright 1965 by Marcel Dekker, Inc., New York; pp. 73-120.

\* cited by examiner

SILICON CARBIDE WITH LOW NITROGEN CONTENT AND METHOD FOR PREPARATION

CROSS REFERENCE TO RELATED APPLICATION

The present invention claims priority from U.S. Provisional Application No. 60/791,061, filed Apr. 11, 2006, which is incorporated herein by reference.

BACKGROUND OF THE INVENTION

1. Field of the Invention

The present invention relates to growing crystals, such as silicon carbide (SiC) crystals, with a low content of unintentional nitrogen impurity.

2. Description of Related Art

Wafers of semi-insulating silicon carbide of 4H and 6H polytypes serve as lattice-matched substrates to grow epitaxial layers of SiC and AlGaN, which are used for the fabrication of SiC- and AlGaN-based microwave devices. In order for the device to work efficiently, the substrate must be semi-insulating, that is, fully compensated electronically. In practical terms, this means that the resistivity of the SiC substrate must be higher than $10^5$ Ohm·cm, as measured at room temperature and under normal room light.

SiC crystals contain impurities and point defects, each with characteristic electronic levels in the bandgap. The levels that lay close to the edges of the bandgap are called "shallow". In 4H and 6H SiC, nitrogen is a shallow donor. The levels positioned closer to the midgap are called "deep". Vanadium and certain point defects produce deep levels in silicon carbide.

The net shallow impurity concentration in a semiconductor is defined as the absolute value of $N_D-N_A$, where $N_D$ and $N_A$ are the concentrations of shallow donors and acceptors, respectively. A semiconductor is fully compensated when the concentration of deep levels is higher than the net shallow impurity concentration. Doping with vanadium and introduction of deep point defects has been used for electronic compensation of silicon carbide.

Unintentional nitrogen donors can be present in SiC crystals at levels as high as $2·10^{17}$ cm$^{-3}$. In order to achieve reliable compensation, the concentration of deep levels should be higher. In general, introduction of deep levels in high concentrations is technologically difficult and can cause stress and generation of defects. A better approach to full compensation would be through a reduced presence of unintentional shallow impurities, first of all, nitrogen.

Physical Vapor Transport (PVT) is the most common sublimation technique used for SiC crystal growth. A schematic diagram of conventional PVT is shown in FIG. 1. A polycrystalline SiC source 2 is loaded at the bottom of a graphite crucible 1, and a SiC seed 4, desirably a single crystal SiC seed 4, is disposed at the top on the lid. The crucible 1 is heated to a growth temperature, generally, between 2000° C. and 2400° C., where source 2 vaporizes and fills the crucible with volatile molecular species of $Si_2C$, $SiC_2$ and Si. During growth, the source 2 temperature is higher than the seed 4 temperature. This temperature difference forces the vapors to migrate and precipitate on seed 4, forming an SiC crystal 3, desirably an SiC single crystal. In order to control the growth rate and ensure high crystal quality, PVT growth is carried out under a small pressure of inert gas, generally between several and 200 Torr. Conventional PVT is a "closed" process in which the Si-bearing vapors do not leave the container, except unintentional losses that can occur through the joint between the crucible body and lid.

SiC crystals have also been grown using an "open" process. In the open process, a deliberate gas flow is established between the crucible interior and exterior. Examples include High Temperature Chemical Vapor Deposition (HTCVD), Halide Chemical Vapor Deposition (HCVD) and some PVT modifications. A generalized diagram of an open SiC crystal growth process is shown in FIG. 2. A gas mixture 11 that may contain Si and C precursors, dopants and/or other reactants enters crucible 10 through inlet 12. Inside crucible 10, the reactants undergo chemical transformations in a reaction zone 14. The reaction products blend with the vapors originating from the polycrystalline SiC source 13 and move toward a SiC seed 17, where they precipitate and form crystal 15. Gaseous products escape through outlet(s) 16 in the lid of crucible 10.

Graphite is widely utilized in SiC crystal growth as a material for crucibles and other parts. Due to the chemical nature and porosity of graphite, it is capable of adsorbing large quantities of air, for instance, up to 100 cc of air per gram of graphite. Upon heating to high temperatures, graphite releases the adsorbed gas, thus becoming one of the principal sources of nitrogen contamination in SiC crystal growth. The present inventors have discovered that another source of nitrogen contamination is $N_2$ from the growth station chamber filtering into the crucible interior through the permeable graphite wall of the crucible.

Migration of a gas through a porous body can be described in terms of permeation or diffusion, which are physically equivalent. While permeability is defined by the volume of gas flowing across a porous wall of unit thickness under unit pressure drop, the diffusivity is defined by the number of molecules moving under unit concentration drop. Gas migration in graphite involves steps of gas adsorption on the pore surface, desorption, surface diffusion and bulk diffusion. Permeability of graphite depends on the nature of the gas and properties of graphite: low-density and open-porosity graphite is more permeable than high-density and closed-porosity graphite. Gases with larger molecules often diffuse faster than those with smaller molecules due to the more extensive trapping of small molecules in the micro-pores of graphite. Extensive trapping and long lifetime in the trapped state slows down diffusion of elements with high chemical affinity for carbon.

Nitrogen contamination in SiC crystal growth can be reduced to some extent using common and well-known conventional techniques. One such technique is evacuation and purge of the chamber with pure inert gas. This technique, however, fails to achieve complete removal of nitrogen from graphite bulk. Another conventional method is based on the use of getters such as titanium. However, application of getters in the conditions of PVT growth is difficult and can lead to severe contamination of the crystal.

A better purity with respect to nitrogen can be achieved in open growth processes, such as HTCVD and HCVD, where the nitrogen concentration in the grown crystals can be reduced to below $10^{16}$ cm$^{-3}$. This can be attributed to the "dilution" effect of the flowing gas and/or to the presence of hydrogen in the growth atmosphere. However, these open growth processes failed to demonstrate high crystal yields, mostly due to the very high losses of silicon-bearing vapors escaping through the crucible outlet(s).

SUMMARY OF THE INVENTION

The present invention is a method for growing SiC crystals, desirably SiC single crystals, with low content of unintentional nitrogen impurity. In accordance with the invention, SiC sublimation growth is carried out in a sealed growth crucible made of graphite. The thickness of the crucible wall is selected to achieve sufficient permeability of the crucible to inert gases and gaseous nitrogen. During growth, a flow of purging gas is established in the crystal growth chamber with the purging gas being a pure inert gas containing a very low concentration of residual nitrogen. The purging flow can be either external with respect to the growth crucible or internal. In the latter case, the purging gas enters the crucible through an inlet and leaves by filtering through the crucible wall. As a result of high permeability of graphite to inert gases and nitrogen, the gas purge leads to a reduced presence of nitrogen in the interior of the growth crucible. At the same time, the low permeability of graphite to the Si-bearing vapor species prevents silicon losses from the crystal growth charge. The grown crystals are characterized by the concentration of unintentional nitrogen donor below $2 \cdot 10^{16}$ cm$^{-3}$ and resistivity above $10^5$ ohm·cm.

More specifically, the invention is a physical vapor deposition method of growing a crystal comprising (a) providing a source crucible charged with source material inside of a growth crucible that is at least in-part gas permeable to an unwanted gas that is present in the charged growth crucible; (b) providing a seed crystal in the growth crucible in spaced relation to the source crucible; (c) heating the interior of the growth crucible whereupon the source material is at a first temperature sufficient to sublimate the source material and the seed crystal is at a second, lower temperature sufficient to cause the sublimated source material to be transported to the seed crystal where the sublimated source material precipitates; and (d) concurrent with step (c), causing a purging gas to flow either inside or outside of the growth crucible, which is also permeable to the purging gas, in a manner whereupon the unwanted gas flows from the inside to the outside of the growth crucible via the gas permeable part thereof.

An exterior wall of the source crucible can be spaced from an interior wall of the growth crucible.

The unwanted gas can be nitrogen. The purging gas can be an inert gas. The growth crucible can be made from graphite. The source material and/or the seed crystal can be made from SiC.

The purging gas can be caused to flow inside the growth crucible at a flow rate between 10 standard cubic centimeters per minute (sccm) and 200 sccm.

When the purging gas is caused to flow outside of the growth crucible, the method can further include providing the growth crucible inside of an insulated chamber with an exterior wall of the growth crucible spaced from an interior wall of the chamber and causing the purging gas to flow through the space between the exterior wall of the growth crucible and the interior wall of the chamber. The purging gas can be caused to flow in said space at a flow rate between 100 sccm and 500 sccm.

The invention is also a physical vapor deposition method of growing a crystal comprising (a) providing a seed crystal and a source material in spaced relation inside of a growth crucible that is at least in-part gas permeable to an unwanted gas therein; (b) heating the growth crucible whereupon the source material sublimates and is transported via a temperature gradient in the growth crucible to the seed crystal where the sublimated source material precipitates; and (c) concurrent with step (b), causing a purging gas to flow inside or outside of the growth crucible in a manner whereupon the unwanted gas flows from the inside to the outside of the growth crucible via the gas permeable part thereof.

The purging gas can be caused to flow inside the growth crucible at a rate between 10 standard cubic centimeters per minute (sccm) and 200 sccm.

The source material can be disposed in a source crucible that is positioned inside the growth crucible.

At least an exterior wall of the source crucible can be spaced from an interior wall of the growth crucible.

The purging gas can be caused to flow outside the growth crucible at a rate between 100 standard cubic centimeters per minute (sccm) and 500 sccm between an exterior of the growth crucible and an interior of an insulated chamber in which the growth crucible is disposed.

The insulated chamber can include around the growth crucible a porous insulation that facilitates the flow of the purging gas.

DETAILED DESCRIPTION OF THE INVENTION

The present invention will be described with reference to the accompanying figures.

Generally, graphite is permeable to inert gases and nitrogen, but has a vastly lower permeability to the vapors formed during sublimation of silicon carbide: Si, $Si_2C$ and $SiC_2$. Accordingly, in the present invention, graphite can be used as a selective filter during SiC sublimation growth—it allows the flow of an inert gas and nitrogen, while restricting the flow of Si-bearing vapors.

Figure 1:
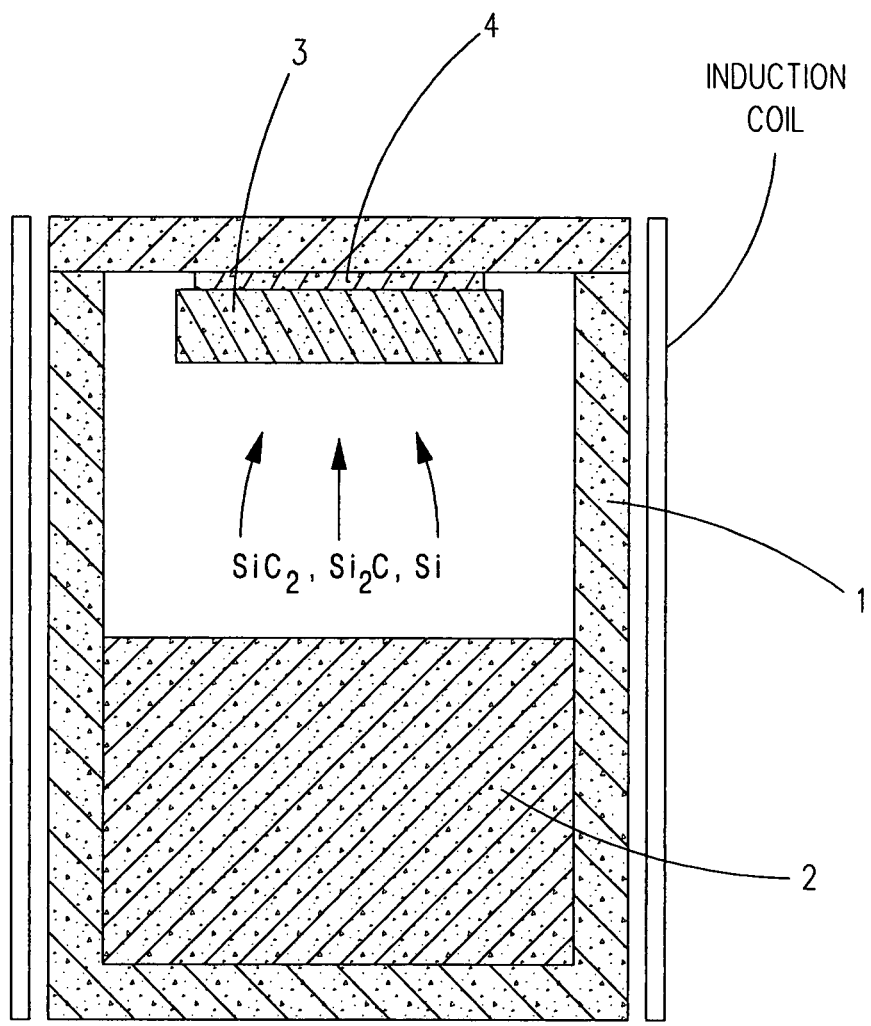
FIGS. 1 and 2 are cross-sectional views of growth vessels for growing crystals, especially silicon carbide crystals, in accordance with the prior art.
Figure 2:
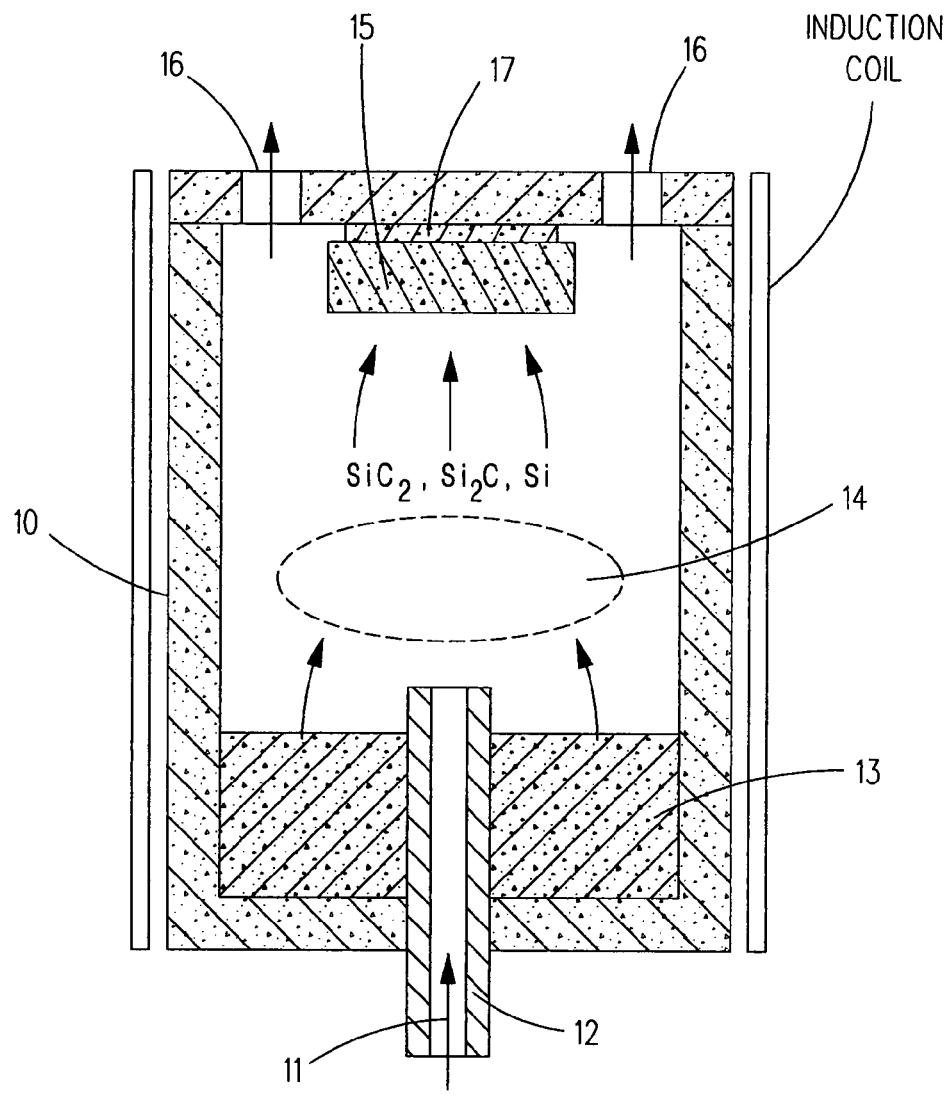
Figure 3:
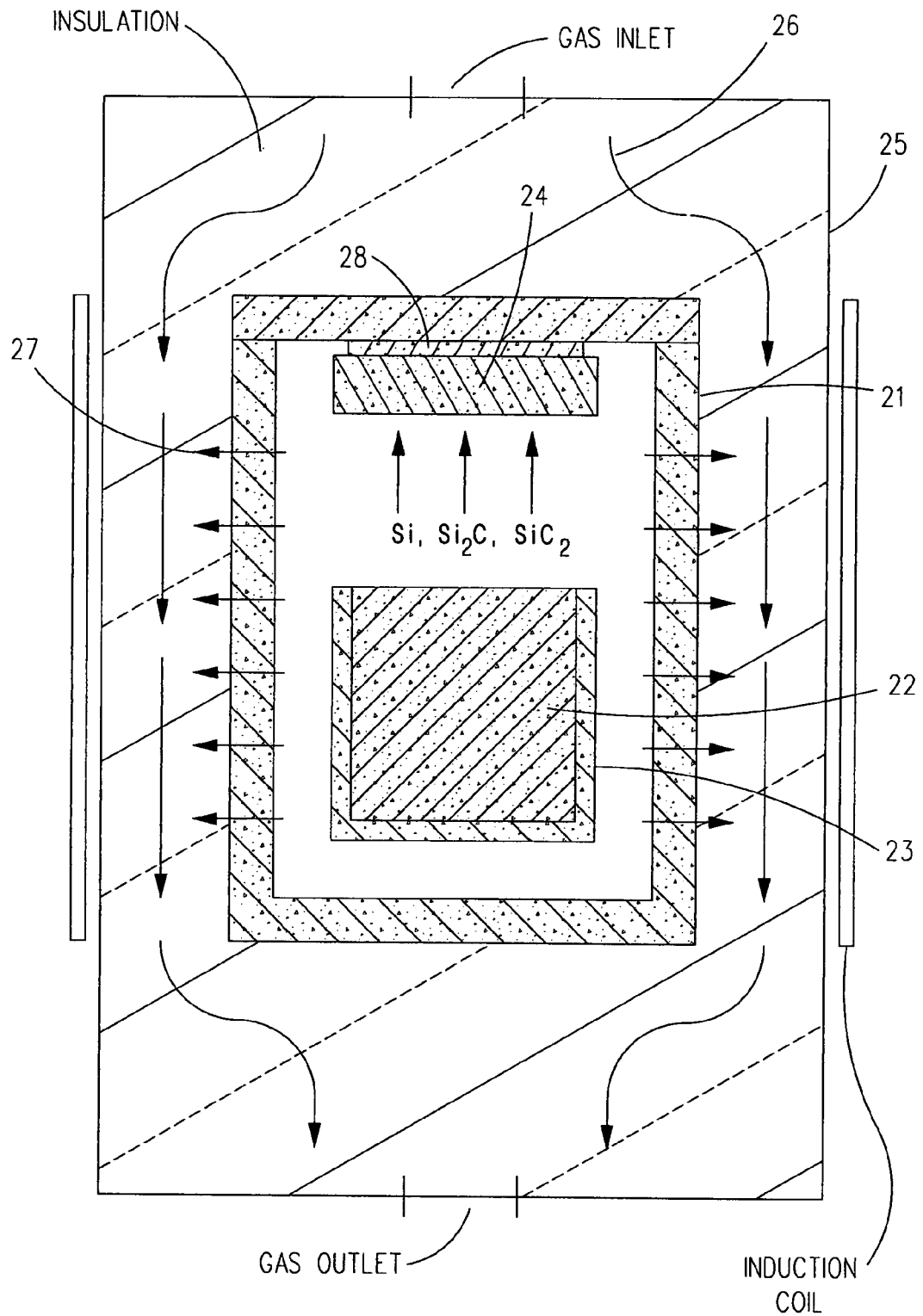
FIG. 3 is a cross-sectional view of a system for growing crystals in accordance with one embodiment of the present invention.

With reference to FIG. 3, PVT sublimation growth of silicon carbide is carried out in a sealed crucible 21 made of graphite, hereinafter, growth crucible 21. Desirably, growth crucible 21 is made of high-density, fine-grain and low-porosity graphite, such as ATJ isomolded graphite available from GrafTech International, LTD of Parma, Ohio, USA, or similar. Growth crucible 21 is loaded with polycrystalline SiC source material 22 and a seed 28 in such a fashion that seed 28 is disposed at the crucible top, while source 22 is disposed in a lower portion of growth crucible 21. Source 22 is desirably contained in a thin-walled graphite crucible called a source crucible 23. The dimensions of the crucibles are such that a gap exists between the outer wall of source crucible 23 and the inner wall of growth crucible 21. In the preferred embodiment, this gap is between 2 and 10 mm wide; more desirably, it is between 4 and 7 mm wide.

Growth crucible 21 loaded with source 22, seed 28 and other necessary parts is placed into a chamber 25, desirably made of fused silica. Between the interior of chamber 25 and the exterior of growth crucible 21, chamber 25 includes an insulation that serves the dual propose of retaining heat in growth crucible 21 while enabling a gas (discussed hereinafter) to flow from a gas inlet to a gas outlet of chamber 25. The illustration of chamber 25 having a gas inlet and a gas outlet at the top and bottom sides thereof is not to be construed as limiting the invention since it is envisioned that the functions of the gas inlet and gas outlet can be reversed if desired.

Prior to growth, chamber 25 is evacuated and purged with a suitable pure inert gas, such as argon or helium, in accordance with the common practice of the conventional PVT process. Following this step, chamber 25 is filled with pure inert gas to a desired pressure, which is, desirably, between several and 200 Torr, and the temperature within crucible 21 is raised to the growth temperature, which is, desirably, between 2000° C. and 2400° C. Crucible 21 is heated in such a fashion that the temperature of source 22 becomes higher than the temperature of seed 28, with the temperature difference desirably between 10° C. and 200° C. As a result, Si, $Si_2C$ and $SiC_2$ molecules sublimed from source 22 are transported to the seed 28 and precipitate on it, causing growth of crystal 24.

Due to the high chemical affinity for nitrogen, the growing SiC crystal 24, generally, absorbs nitrogen from the growth crucible atmosphere, thus acting during growth as a nitrogen sink. This lowers the nitrogen partial pressure in growth crucible 21 and, in the conventional PVT process, creates harmful nitrogen flows within the porous wall of growth crucible 21 directed toward the interior thereof. These flows include the flow of nitrogen released from the bulk of the crucible wall and the flow of nitrogen from chamber 25.

In accordance with the present invention, a flow of high-purity purging gas 26 is supplied continuously during the growth of crystal 24 into chamber 25. This gas purge reduces the supply of nitrogen into the interior of growth crucible 21 and, thus, reduces the level of unintentional nitrogen in crystal 24.

More specifically, a high-purity inert gas 26, desirably argon or helium, is used as a purging gas. The purging gas has a low concentration of residual nitrogen, desirably less than 100 ppb of nitrogen and, more desirably less than 10 ppb of nitrogen.

One embodiment of the present invention, referred to as an exterior purge, is shown in FIG. 3. In this embodiment, purging gas 26 is supplied continuously during growth into chamber 25. Due to the dilution and direct removal of nitrogen by the purging gas from chamber 25, the nitrogen concentration outside crucible 21 becomes lower than in the interior of crucible 21. As a result, nitrogen concentration gradients emerge across the wall of the growth crucible 21. Driven by these gradients, nitrogen filters through the porous graphite wall in the direction from the interior of crucible 21 toward the exterior of crucible 21, as shown by arrows 27 in FIG. 3. The net effect of the gas purge is reduced concentration of unintentional nitrogen in the interior of crucible 21 and, hence, in crystal 24.

Figure 4:
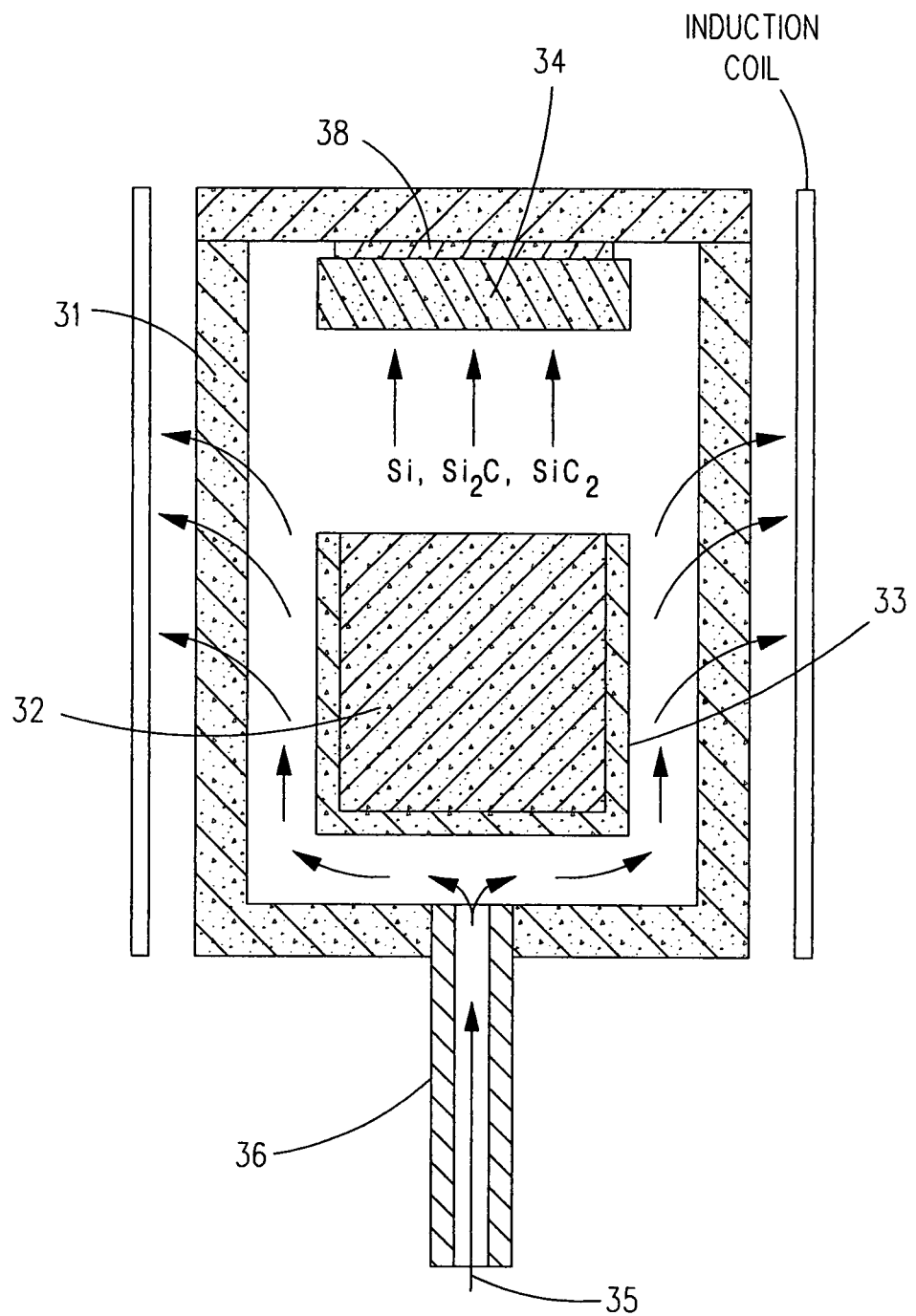
FIG. 4 is a cross-sectional view of a system for growing crystals in accordance with another embodiment of the present invention.

Another embodiment of the present invention, referred to as an interior purge, is shown in FIG. 4. In this embodiment, a purging gas 35 is supplied directly into a growth crucible 31 through an inlet port 36, which is desirably in the lower portion of the growth crucible.

After entering growth crucible 31 through inlet port 36, purging gas 35 flows within a gap between growth crucible 31 and a source crucible 33 (which is like source crucible 22 in the embodiment shown in FIG. 3) and escapes from growth crucible 31 by filtering through the porous wall thereof. This path of the flowing gas permits efficient gas purge, but it does not perturb the growth-related mass transport processes in the vicinity of the growing crystal 34.

In order for the purge to be effective, the flow of purging gas is desirably between 100 and 500 standard cubic centimeters per minute (sccm) in the case of exterior purge and, desirably, between 20 and 200 sccm in the case of interior purge. In the latter case, a too high flow can create a harmful overpressure inside crucible 21 and/or disturb the growth process, while a too low flow can be ineffective or lead to the escape of Si-bearing vapors through inlet port 36.

The wall of each crucible 21 and 31 should be thin enough to allow efficient gas exchange between the interior and exterior thereof. At the same time, the crucible wall must not be too thin; otherwise, it may become transparent to the Si-bearing vapors and cause Si losses from the crystal growth charge. Desirably, the thickness of the crucible wall is between 4 mm and 20 mm and, more desirably, between 8 mm and 16 mm.

The present invention has the following features:

1. PVT sublimation growth of SiC crystals is carried out under continuous flow of high-purity purging gas, desirably argon or helium, containing a very low residual nitrogen concentration at a level desirably below 100 ppb and more desirably below 10 ppb.

2. The invention covers two modes of gas purge: exterior and interior. In the exterior mode, the purging gas is supplied into chamber 25 with the flow desirably between 100 and 500 standard cubic centimeters per minute (sccm).

3. In the interior purge mode, the purging gas is supplied directly into the interior of the graphite growth crucible 31 through an inlet port and leaves the crucible by filtering through the wall of crucible 31. In this mode, the flow rate of the purging gas is desirably between 10 sccm and 200 sccm, and more desirably between 20 sccm and 100 sccm.

4. The SiC source is contained in a thin-walled crucible, which is disposed inside the growth crucible in such a fashion that a gap exists between the wall of the growth crucible and the wall of the source crucible. This gap facilitates efficient removal of nitrogen from the growth crucible. The gap is desirably between 2 mm and 10 mm wide, and more desirably between 4 mm and 7 mm wide.

5. The crucible wall is, desirably, between 4 mm and 20 mm thick, and more desirably between 8 mm and 16 mm thick.

6. Depending on the type of the crystal being grown, the purging gas may contain gaseous additives. Examples of gas additives include, but are not limited to, hydrogen, Si-bearing gases, C-bearing gases, Cl-bearing gases and F-bearing gases.

The present invention provides:

Reduced concentration of unintentional nitrogen donors in 6H and 4H SiC crystals;

Higher and spatially more uniform resistivity in semi-insulating SiC crystals; and Higher yield of semi-insulating substrates per boule.

A number of nominally undoped 6H SiC single crystals grown in accordance with the present invention under continuous gas purge using the external purge mode, exhibited reduced concentrations of unintentional nitrogen, typically, below $2 \cdot 10^{16}$ cm$^{-3}$, and a resistivity above $10^5$ ohm·cm.

The growth of these SiC crystals were carried out at a growth temperature of 2050° C. at a helium pressure of 10 Torr. High-purity polycrystalline SiC synthesized prior to growth in a separate process was used as a source.

The growth was carried out under continuous gas purge, which was supplied into the chamber of the growth station, i.e., in the external purge mode illustrated in FIG. 3. The purging gas was pure helium with the concentration of residual nitrogen below 10 ppb. The flow of the purging gas was 200 sccm. The growth crucible was made of high-density, low-porosity, fine-grain graphite. The thickness of the crucible wall was 12 mm.

Figure 5:
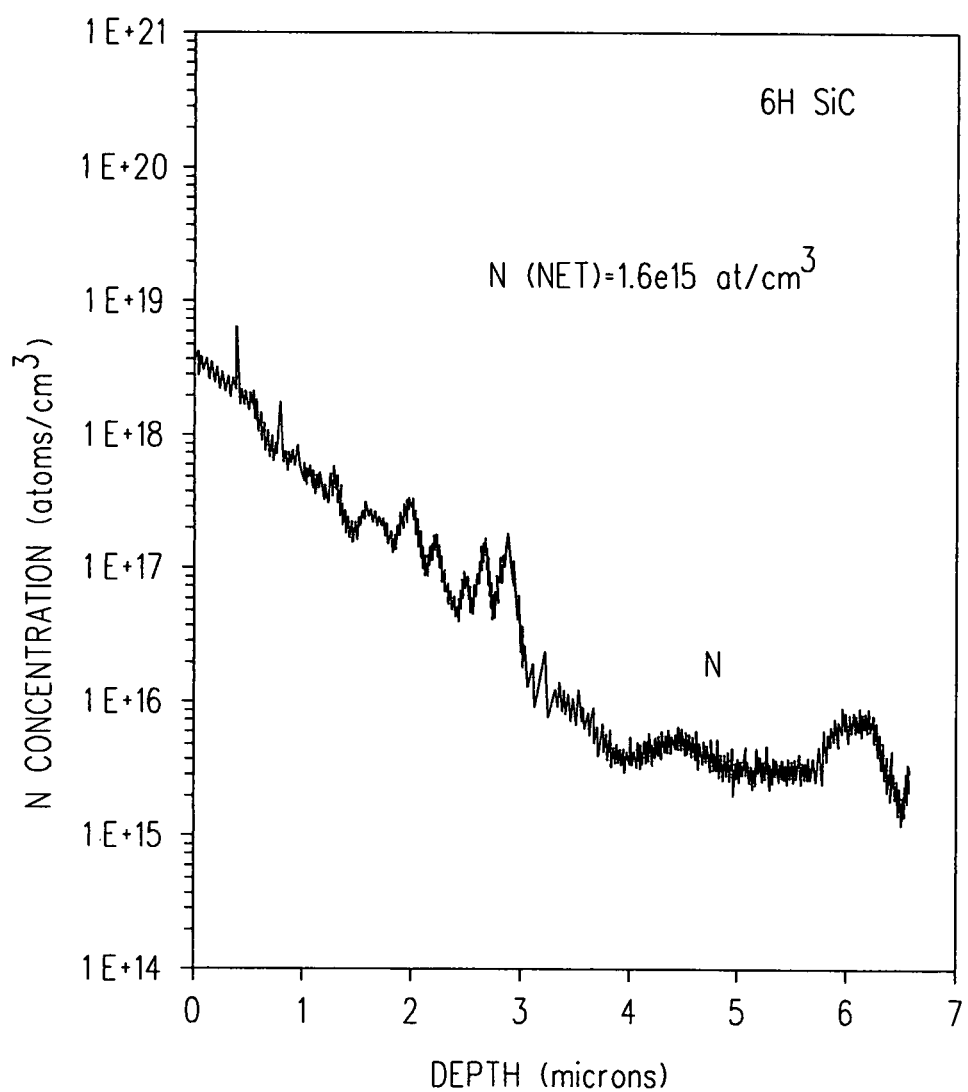
FIG. 5 is a graph of concentration versus depth of a single wafer extracted from a crystal boule grown utilizing the system shown in FIG. 3.

The grown boule was sliced into 2-inch diameter, 400 microns thick wafers. Nitrogen content in the grown material was determined using Secondary Ion Mass Spectroscopy (SIMS). The results obtained for one of the wafers of the boule are shown in FIG. 5. The SIMS concentration profile shows that the nitrogen concentration in the wafer bulk is about $1.6 \cdot 10^{15}$ cm$^{-3}$. The resistivity of the boule was about $10^9$ ohm·cm.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A physical vapor deposition method of growing a crystal comprising:
   (a) providing a source crucible charged with source material inside of an enclosed growth crucible which at least in-part has a first permeability to an unwanted gas that is present in the charged growth crucible, wherein said part of the growth crucible has a second, lower permeability to sublimated source material;
   (b) providing a seed crystal in the growth crucible in spaced relation to the source crucible;
   (c) heating the interior of the growth crucible whereupon the source material is at a first temperature sufficient to sublimate the source material and the seed crystal is at a second, lower temperature sufficient to cause the sublimated source material to be transported to the seed crystal where the sublimated source material precipitates; and
   (d) concurrent with step (c), causing a purging gas to flow either inside or outside of the growth crucible, which is also permeable to the purging gas, at a flow rate whereupon a concentration gradient of the unwanted gas forms across said part of the growth crucible, whereupon the unwanted gas flows from the inside to the outside of the growth crucible via said part of the growth crucible.

2. The method of claim 1, wherein an exterior wall of the source crucible is spaced from an interior wall of the growth chamber.

3. The method of claim 1, wherein, the unwanted gas is nitrogen, the purging gas is inert gas, or both.

4. The method of claim 1, wherein growth crucible is made from graphite.

5. The method of claim 1, wherein the source material and the seed crystal are made from SiC.

6. The method of claim 1, wherein in step (d), the purging gas is caused to flow inside the growth crucible at a flow rate between 10 standard cubic centimeters per minute (sccm) and 200 sccm.

7. The method of claim 1, wherein, when the purging gas is caused to flow outside of the growth crucible, the method further includes providing the growth crucible inside of an insulated chamber with an exterior wall of the growth crucible spaced from an interior wall of the chamber; and causing the purging gas to flow through the space between the exterior wall of the growth crucible and the interior wall of the chamber.

8. The method of claim 7, wherein the purging gas is caused to flow in said space at a flow rate between 100 sccm and 500 sccm.

9. The method of claim 1, wherein the purging gas is comprised of at least one of the following: argon, helium, hydrogen, a Si-bearing gas, a C-bearing gas, a Cl-bearing gas and a F-bearing gas.

10. A physical vapor deposition method of growing a crystal comprising:
    (a) providing a seed crystal and a source material in spaced relation inside of an enclosed growth crucible that at least in-part has a first permeability to an unwanted gas therein, wherein said part of the growth crucible has a second, lower permeability to sublimated source material;
    (b) heating the growth chamber whereupon the source material sublimates and is transported via a temperature gradient in the growth chamber to the seed crystal where the sublimated source material precipitates; and
    (c) concurrent with step (b), causing a purging gas to flow inside or outside of the growth crucible at a rate whereupon a concentration gradient of the unwanted gas forms across said part of the growth crucible, whereupon the unwanted gas flows from the inside to the outside of the growth crucible via said part of the growth crucible.

11. The method of claim 10, wherein the purging gas is caused to flow inside the growth crucible at a rate between 10 standard cubic centimeters per minute (sccm) and 200 sccm.

12. The method of claim 10, wherein the source material is disposed in a source crucible that is positioned inside the growth crucible.

13. The method of claim 12, wherein at least an exterior wall of the source crucible is spaced from an interior wall of the growth crucible.

14. The method of claim 13, wherein the purging gas is caused to flow outside the growth crucible at a rate between 100 standard cubic centimeters per minute (sccm) and 500 sccm between an exterior of the growth crucible and an interior of an insulated chamber in which the growth crucible is disposed.

15. The method of claim 14, wherein the insulated chamber includes around the growth crucible a porous insulation that facilitates the flow of the purging gas.

16. The method of claim 10, wherein the unwanted gas is nitrogen, the purging gas is inert gas, or both.

17. The method of claim 10, wherein the growth crucible is comprised of graphite.

18. The method of claim 10, wherein the source material and the seed crystal comprise SiC.

19. The method of claim 10, wherein the purging gas is comprised of at least one of the following: argon, helium, hydrogen, silicon, carbon, chlorine and fluorine.

* * * * *